United States Patent [19]
Gehrke

[11] 3,982,210
[45] Sept. 21, 1976

[54] AUTOMATIC GAIN CONTROL CIRCUIT FOR A CRYSTAL OSCILLATOR

[75] Inventor: James Keith Gehrke, Carpentersville, Ill.

[73] Assignee: Motorola, Inc., Schaumburg, Ill.

[22] Filed: Oct. 22, 1975

[21] Appl. No.: 624,617

[52] U.S. Cl. ............................ 331/109; 331/116 R; 331/183
[51] Int. Cl.² ...................... H03B 3/02; H03B 5/36
[58] Field of Search ................ 331/109, 116 R, 183

[56] References Cited
UNITED STATES PATENTS

| | | | |
|---|---|---|---|
| 3,213,390 | 10/1965 | Faith et al. | 331/116 R X |
| 3,321,715 | 5/1967 | Bloch | 331/183 X |
| 3,761,840 | 9/1973 | Bremer | 331/116 R |
| 3,806,831 | 4/1974 | Kleinberg | 331/116 R |

Primary Examiner—Siegfried H. Grimm
Attorney, Agent, or Firm—Sang Ki Lee; Parsons Eugene A.; James W. Gillman

[57] ABSTRACT

A single bipolar transistor crystal oscillator with the bias on the base of the transistor fixed and a second transistor coupled in parallel with the transistor of the oscillator for providing an alternate current path when the second transistor is conducting to reduce the current gain of the oscillator transistor, and a diode connected to the base of the second transistor for rectifying the AC output signals of the oscillator and biasing the second transistor into conduction when the output of the oscillator exceeds a predetermined value.

7 Claims, 2 Drawing Figures

AUTOMATIC GAIN CONTROL CIRCUIT FOR A CRYSTAL OSCILLATOR

BACKGROUND OF THE INVENTION

Automatic gain control circuits are utilized to solve a number of problems in single bipolar transistor crystal oscillators. For example, the amplitude of the oscillator output will be controlled, eliminating problems with variations in mixer injection level produced by crystal resistance and transistor current gain tolerances. Further, crystal dissipation can be held at a low level without sacrificing other parameters such as warp range or output level stability. Controlling the crystal dissipation is important because high levels of crystal dissipation degrade frequency stability and further cause aging and spurious responses.

Prior art automatic gain control circuits make use of the bipolar transistor current gain going to zero as collector current goes to zero. All known prior art circuits use at least one active device for amplification and another to control the collector current of the oscillator transistor. This use of several active devices in the prior art circuits increases both the size and cost thereof.

SUMMARY OF THE INVENTION

The present invention pertains to an automatic gain control circuit for a single bipolar transistor crystal oscillator wherein the base terminal of the transistor is held at a fixed value by a fixed bias circuit and a second transistor is connected with the emitter-collector junction in parallel with the emitter-collector junction of the oscillator transistor for providing an alternate current path for current flowing to the oscillator transistor when the second transistor is conducting to reduce the current gain of the transistor in the oscillator and biasing means couple the base of the second transistor to the output of the oscillator for sensing the amplitude of signals at the output of the oscillator and controlling the conduction of the second transistor to maintain the output signals of the oscillator approximately at a predetermined level.

It is an object of the present invention to provide a new and improved automatic gain control circuit for a crystal oscillator.

It is a further object of the present invention to provide a new and improved automatic gain control circuit for a single bipolar transistor crystal oscillator having reduced size and cost.

These and other objects of this invention will become apparent to those skilled in the art upon consideration of the accompanying specification, claims and drawings.

BRIEF DESCRIPTION OF THE DRAWINGS

Referring to the drawings, wherein like characters indicate like parts throughout the FIGURES.

DESCRIPTION OF THE PREFERRED EMBODIMENTS

Figure 1:
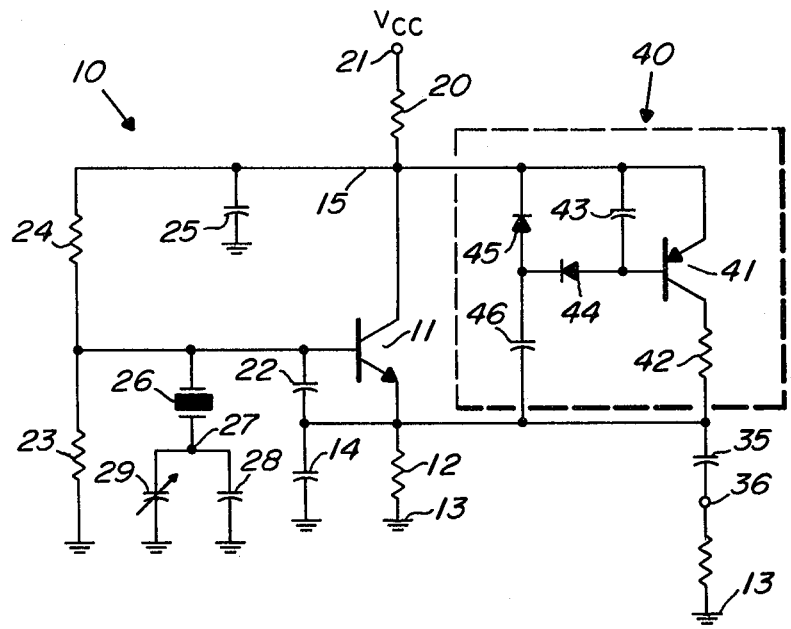
FIG. 1 is a schematic diagram of an automatic gain control circuit attached to a crystal oscillator and embodying the present invention.

Referring specifically to FIG. 1, the numeral 10 generally designates a single bipolar transistor crystal oscillator, which in this embodiment is a Colpitts oscillator. The oscillator 10 includes an NPN type transistor 11. The emitter of the transistor 11 is connected through a resistor 12 to a reference point, which in this embodiment is ground 13 and through a capacitor 14 to ground 13. The collector of the transistor 11 is connected directly to a B+ bus 15, which is connected through a resistor 20 to a positive terminal 21 adapted to have a positive source of voltage attached thereto. The base of the transistor 11 is connected to the emitter through a capacitor 22. The base is also connected through a resistor 23 to ground and through a resistor 24 to the B+ bus 15. The B+ bus 15 is AC coupled to ground through a bypass capacitor 25. The base of the transistor 11 is connected to one side of a crystal 26 the other side of which is connected to a junction 27. The junction 27 is connected to ground through a fixed capacitor 28 and through a parallel connected, variable capacitor 29. The output of the oscillator 10 is taken from the emitter of the transistor 11 and supplied through a coupling capacitor 35 to a output terminal 36. A load, illustrated as a resistor designated $R_1$, is connected between the output terminal 36 and ground 13.

An automatic gain control circuit, designated 40, is connected between the emitter of the transistor 11 and the B+ bus 15 as follows. A PNP type transistor 41 has an emitter connected directly to the B+ bus 15 and a collector connected through a resistor 42 to the emitter of the transistor 11. The base of the transistor 41 is connected through a capacitor 43 to the B+ bus 15 and to the anode of a diode 44. The cathode of the diode 44 is connected to the anode of a diode 45 and through a capacitor 46 to the emitter of the transistor 11. The cathode of the diode 45 is connected directly to the B+ bus 15.

The operation of the oscillator 10 and the various components thereof is well known to those skilled in the art and will not be discussed further. The capacitor 46 couples the AC output of the oscillator 10 to the junction of the diodes 44 and 45. When the peak output voltage of the oscillator 10 at the junction is greater than the junction voltage of the semiconductor diode 45, the diode 45 starts rectifying the AC signal by passing all of the positive peaks while presenting a very high impedance to the negative peaks. In a similar fashion the diode 44 passes the negative peaks and presents a very high impedance to the positive peaks. Thus, the capacitor 43 charges until the base of the transistor 41 reaches a value sufficient to cause conduction. Once the transistor 41 turns on a current path is completed through the transistor 41 (emitter to collector), the resistor 42 and the resistor 12 to round 13. The emitter voltage of the transistor 11 is set by the base bias resistors 23 and 24 and the base to emitter junction voltage of the transistor 11. The transistor 41 is in parallel with the transistor 11 and provides an alternate path for current flowing thereto. That is, the current flowing through the transistor 41 subtracts from the available collector current for the transistor 11 and, therefore, the current gain of transistor 11 is reduced. Reducing the current gain of the transistor 11 reduces the amplitude of the signal at the output of the oscillator 10. The steady state AC output level of the oscillator 10 is set at a peak voltage slightly greater than one half the base to emitter junction potential of transistor 41 plus the junction drop of the diode 45. The base voltage of the transistor 11 is set by the fixed bias and does not change with the operation of the automatic gain control circuit. Further, the automatic gain control circuit does not affect the base to collector capacitance of the transistor 11 so that the frequency stability of the oscillator 10 is not affected.

Figure 2:
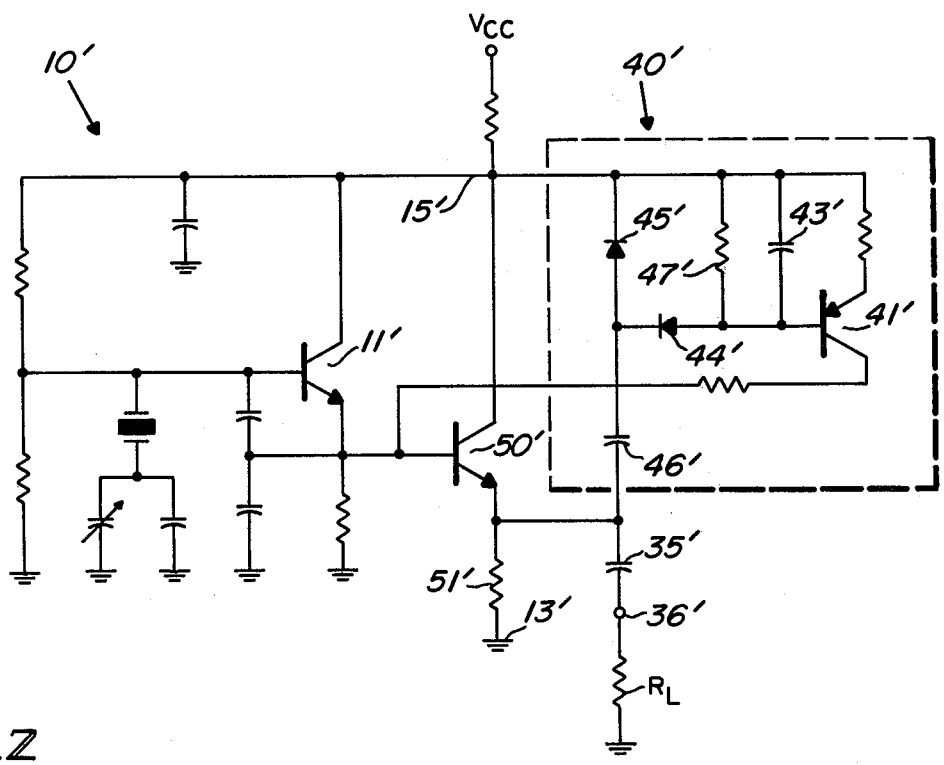
FIG. 2 is a schematic diagram similar to FIG. 1 of another embodiment of the present invention.

Referring specifically to FIG. 2, another embodiment of the invention is illustrated. Throughout FIG. 2, parts similar to those illustrated in FIG. 1 are designated with the same number and all numbers have a prime added to indicate that it is a different embodiment. The oscillator 10' is a single bipolar transistor crystal oscillator similar to that illustrated in FIG. 1. The automatic gain control circuit 40' is similar to that illustrated in FIG. 1 except that a resistor 47' is connected between the base of the transistor 41' and the B+ bus 15'. The resistor 47' and the capacitor 43' operate as a filter (as explained in conjunction with FIG. 1) to filter the rectified DC which is applied to the base of the transistor 41'. Further, the diode 44' operates as a voltage doubler to increase sensitivity of the circuit (as the diode 44 does in the circuit of FIG. 1). In the circuit of FIG. 2 a second NPN type transistor 50' has a collector connected directly to the B+ bus 15', a base connected to the emitter of the transistor 11' and an emitter connected through a resistor 51' to ground 13'. The transistor 50' is connected as an emitter follower to further reduce loading of the oscillator 10' and, therefore, the output terminal 36' is connected through the coupling capacitor 35' to the emitter of the transistor 50'. Further, the capacitor 46' is connected to the emitter of the transistor 50', rather than the emitter of the transistor 11' (as in the circuit of FIG. 1). Thus, the transistor 41' is still connected in parallel with the transistor 11' and the diode 45', which operates as a biasing means for the transistor 41' is coupled to the output of the oscillator 10' through the capacitor 46' and the emitter follower, transistor 50'.

Thus, a new and improved automatic gain control circuit for a crystal oscillator is disclosed. The new gain control circuit utilizes a single active device and can be easily incorporated into an integrated circuit to substantially reduce the cost and size. The AC level turn on point of the gain control is determined by the diodes 44, 44' and transistor 41, 41'. It will of course be understood by those skilled in the art that this point can be varied by adding additional diodes to increase the turn on point, additional circuitry to produce conduction at a lower AC signal level, etc.

While I have shown and described specific embodiments of this invention, further modifications and improvements will occur to those skilled in the art. I desire it to be understood, therefore, that this invention is not limited to the particular form shown and I intend in the appended claims to cover all modifications which do not depart from the spirit and scope of this invention.

I claim:
1. An automatic gain control circuit for a crystal oscillator comprising:
   a. a crystal controlled oscillator with an output and including a transistor with a fixed bias in combination with a tank circuit;
   b. transistor means having first, second and control terminals, the first and second terminals coupling said transistor means in parallel with the trnsistor of said oscillator for providing an alternate current path for current flowing to the transistor when said transistor means is conducting to reduce the current gain of said transistor; and
   c. biasing means coupled to the output of said oscillator and to the control terminal of said transistor means for sensing the amplitude of signals at the output of said oscillator and controlling the conduction of said transistor means to maintain the signals approximately at a predetermined level.

2. An automatic gain control circuit for a crystal oscillator as claimed in claim 1 wherein the oscillator is a single bipolar transistor crystal oscillator.

3. An automatic gain control circuit for a crystal oscillator as claimed in claim 1 wherein the oscillator includes a Colpitts oscillator.

4. An automatic gain control circuit for a crystal oscillator as claimed in claim 1 wherein the transistor means includes a single transistor having an emitter and a collector for the first and second terminals.

5. An automatic gain control circuit for a crystal oscillator as claimed in claim 4 wherein the biasing means includes a semiconductor diode connected to rectify AC signals from the output of the oscillator and apply the rectified signals to the control terminal of the single transistor, said diode setting a lower limit for the conduction of said single transistor.

6. An automatic gain control circuit for a crystal oscillator as claimed in claim 5 wherein the biasing means further includes a second semiconductor diode connected in a manner to produce transistor conduction at a peak AC signal equal to one half the transistor base to emitter junction potential plus one diode junction potential.

7. An automatic gain control circuit for a crystal oscillator comprising:
   a. a single bipolar transistor crystal oscillator with an output, the transistor having base, collector and emitter terminals, the base terminal being connected to a fixed bias;
   b. a second transistor having base, collector and emitter terminals with the collector and emitter terminals coupled in parallel with the collector and emitter terminals of the transistor in the oscillator for providing an alternate current path for current flowing to the transistor when said second transistor is conducting to reduce the current gain of the transistor in said oscillator; and
   c. biasing means coupled to the output of said oscillator and to the base of said second transistor for sensing the amplitude of signals at the output of said oscillator and controlling the conduction of said second transistor to maintain the signals approximately at a predetermined level.

* * * * *